US008125851B2

(12) United States Patent
Ko et al.

(10) Patent No.: US 8,125,851 B2
(45) Date of Patent: Feb. 28, 2012

(54) APPARATUS AND METHOD FOR CONTROLLING ACOUSTIC RADIATION PATTERN OUTPUT THROUGH ARRAY OF SPEAKERS

(75) Inventors: Sang-chul Ko, Seoul (KR); Young-tae Kim, Seongnam-si (KR); Jung-ho Kim, Yongin-si (KR); Jung-woo Choi, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 338 days.

(21) Appl. No.: 12/469,917

(22) Filed: May 21, 2009

(65) Prior Publication Data

US 2010/0157740 A1 Jun. 24, 2010

(30) Foreign Application Priority Data

Dec. 18, 2008 (KR) ........................ 10-2008-0129342

(51) Int. Cl.
*H04B 1/02* (2006.01)
*G03B 42/06* (2006.01)
*H03G 5/00* (2006.01)

(52) U.S. Cl. ............. 367/138; 367/11; 367/137; 381/99

(58) Field of Classification Search .................... 367/12, 367/137, 138; 381/99
See application file for complete search history.

(56) References Cited

U.S. PATENT DOCUMENTS 5,233,664 A * 8/1993 Yanagawa et al. .............. 381/89
5,530,683 A * 6/1996 Lindberg ...................... 367/164
5,610,986 A * 3/1997 Miles .............................. 381/27
5,808,967 A * 9/1998 Yu et al. .......................... 367/91
5,870,484 A * 2/1999 Greenberger ................. 381/300
6,128,395 A * 10/2000 De Vries ....................... 381/387
6,363,033 B1 * 3/2002 Cole et al. ..................... 367/138
2002/0131608 A1 * 9/2002 Lobb et al. .................... 381/111
2004/0105558 A1 * 6/2004 Montag et al. .................. 381/98
2005/0007882 A1 * 1/2005 Bachelor et al. .............. 367/103
2005/0169485 A1 * 8/2005 Ohta ............................... 381/63

(Continued)

FOREIGN PATENT DOCUMENTS

JP 2004-172661 6/2004

(Continued)

OTHER PUBLICATIONS

Jun Yang, Woon-Seng Gan, Khim-Sia Tan, Meng-Hwa Er, "Acoustic beamforming of a parametric speaker comprising ultrasonic transducers", Sensors and Actuators A: Physical, vol. 125, Issue 1, Oct. 21, 2005, pp. 91-99.*

*Primary Examiner* — Thomas Tarcza
*Assistant Examiner* — James Hulka
(74) *Attorney, Agent, or Firm* — NSIP Law

(57) ABSTRACT

Provided are an apparatus and method for controlling an acoustic radiation pattern output through an array of speakers. The apparatus stores a plurality of filter values for forming a plurality of corresponding control patterns set in advance from an input signal. The apparatus forms a compensation control pattern such that signals output through the array of speakers have an intended pattern in consideration of a filter value of a focusing filter. The apparatus selects at least one of the control patterns set in advance to form the compensation control pattern, and processes the input signal using a filter value corresponding to the selected control pattern.

25 Claims, 11 Drawing Sheets

U.S. PATENT DOCUMENTS

| | | | | |
|---|---|---|---|---|
| 2005/0271223 | A1 | 12/2005 | Itabashi et al. | |
| 2006/0023890 | A1* | 2/2006 | Kaminuma | 381/18 |
| 2006/0062411 | A1* | 3/2006 | Sako et al. | 381/310 |
| 2008/0192577 | A1* | 8/2008 | Knobloch | 367/137 |
| 2008/0273716 | A1* | 11/2008 | Saito et al. | 381/93 |
| 2009/0034763 | A1* | 2/2009 | Takumai | 381/300 |

FOREIGN PATENT DOCUMENTS

| | | |
|---|---|---|
| JP | 2006-025153 | 1/2006 |
| JP | 2006-060610 | 3/2006 |
| JP | 2007-110455 | 4/2007 |
| KR | 10-2008-0064622 | 7/2008 |

* cited by examiner

APPARATUS AND METHOD FOR CONTROLLING ACOUSTIC RADIATION PATTERN OUTPUT THROUGH ARRAY OF SPEAKERS

CROSS-REFERENCE TO RELATED APPLICATION(S)

This application claims the benefit under 35 U.S.C. §119(a) of a Korean Patent Application No. 10-2008-129342, filed on Dec. 18, 2008, the disclosure of which is incorporated herein in its entirety by reference.

BACKGROUND

1. Field

The following description relates to a speaker array system, and more particularly, to an apparatus and method for controlling an acoustic radiation pattern output through an array of speakers.

2. Description of Related Art

An array of speakers, that is, a speaker array includes a plurality of speakers and is used to adjust a direction of sound to be reproduced or deliver sound to a specific region. According to the principle of sound transmission, that is, directivity, a plurality of sound source signals are superimposed to increase the signal intensity in a specific direction using phase differences between the sound source signals, so as to transmit the sound source signal in the specific direction. A plurality of speakers may be arranged in a specific array form, and sound source signals output through the respective speakers may be adjusted to implement such directivity.

To obtain an intended frequency beam pattern, a general speaker array system uses filter values, gain and delay values, and the like appropriate for the intended beam pattern calculated in advance. Thus, in this case, a beam pattern not recorded in advance may not be formed, and moreover, the recorded beam pattern may not be modified.

SUMMARY

According to one general aspect, there is provided an apparatus for controlling an acoustic radiation pattern output through an array of speakers, including a focusing filter to process an input signal to form an acoustic radiation pattern, a control pattern filter to store a plurality of filter values for forming a plurality of corresponding control patterns set in advance from the input signal, and process the input signal using a filter value corresponding to at least one control pattern selected according to a control pattern selection signal, and a controller to generate the control pattern selection signal for selecting the at least one of the control patterns in order to generate a compensation control pattern such that signals output through the array of speakers have an intended pattern, which is an intended acoustic radiation pattern, using a filter value of the focusing filter and a filter value for the intended pattern.

The apparatus may further include a user interface to receive a user input signal for setting the intended pattern.

To generate the compensation control pattern, the controller may generate the control pattern selection signal to select at least one of a control pattern to be added to a reference pattern formed by the focusing filter and a control pattern for removing the whole or a part of the reference pattern.

In response to the compensation control pattern not being included in the plurality of control patterns, the controller may generate the control pattern selection signal to select at least two of the control patterns to be combined into the compensation control pattern.

In response to the controller combining the at least two control patterns into the compensation control pattern, the controller may calculate form factors which are weight data about the respective control patterns used to combine the at least two control patterns.

The filter value of the reference pattern formed by the focusing filter may be orthogonal to a plurality of filter values corresponding to the plurality of control patterns, and the filter values corresponding to the control patterns may be orthogonal to each other.

The apparatus may further include a signal synthesizer to synthesize a first output signal that is the input signal processed and output by the focusing filter with a second output signal that is the input signal processed and output by the control pattern filter, and an output unit to output the synthesized signal.

The apparatus may further include a first output unit to output a first output signal that is the input signal processed and output by the focusing filter, and a second output unit to output a second output signal that is the input signal processed and output by the control pattern filter.

According to another aspect, there is provided an apparatus for controlling an acoustic radiation pattern output through an array of speakers, including a control pattern filter to store a plurality of filter values for forming a plurality of corresponding control patterns set in advance from an input signal, and process the input signal using a filter value corresponding to at least one control pattern selected according to a control pattern selection signal, and a controller to receive a filter value of a focusing filter processing the input signal to form an acoustic radiation pattern from another apparatus, and generate the control pattern selection signal to select the at least one of the control patterns in order to generate a compensation control pattern such that signals output through the array of speakers have an intended pattern using the filter value of the focusing filter and a filter value for the intended pattern.

According to still another aspect, there is provided a method of controlling an acoustic radiation pattern output through an array of speakers, the method including setting an intended pattern, which is an intended acoustic radiation pattern, generating a compensation control pattern such that signals output through the array of speakers have the intended pattern using a filter value of a focusing filter processing an input signal to form an acoustic radiation pattern and a filter value for the intended pattern, generating a control pattern selection signal to select at least one of a plurality of control patterns in order to generate the compensation control pattern, and processing the input signal using a filter value corresponding to the control pattern selected according to the control pattern selection signal.

Other features and aspects will be apparent from the following detailed description, the drawings, and the claims.

Figure 1:
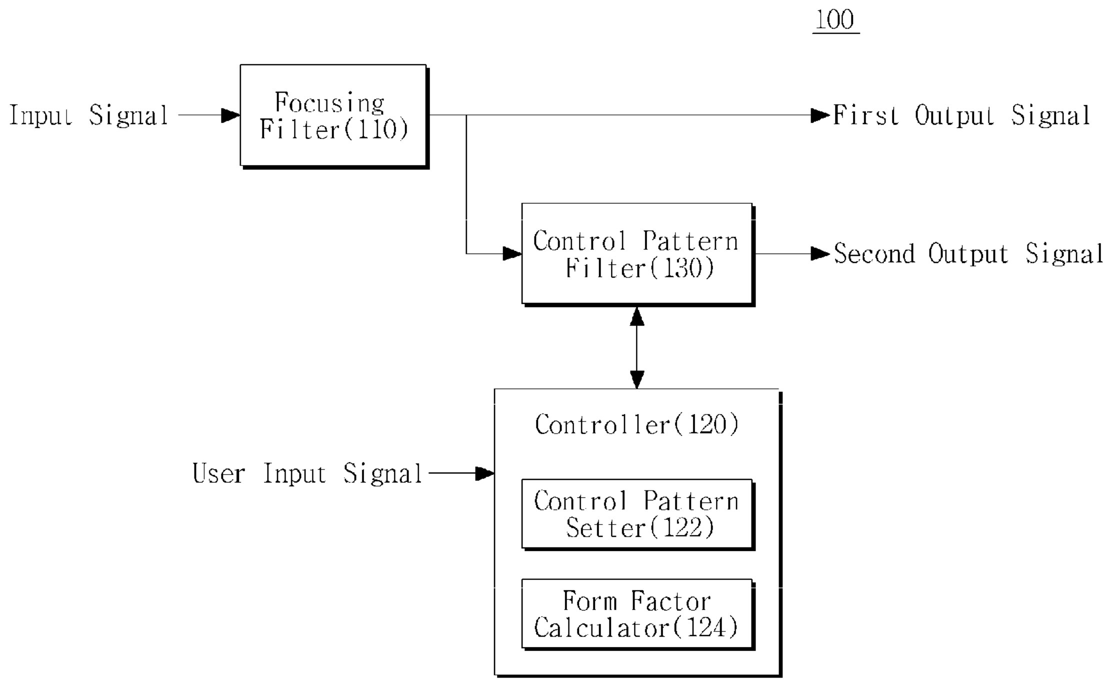
FIG. 1 is a block diagram illustrating an exemplary apparatus to control an acoustic radiation pattern output through a speaker array.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

In the following description, an acoustic radiation pattern denotes a pattern of a sound field formed by sound radiated from a signal output apparatus such as a speaker or antenna. A sound field conceptually denotes an area of sound pressure output in all directions from a sound source. Here, sound pressure denotes force of acoustic energy using the physical quantity of pressure. An acoustic signal radiated from an array of speakers is received by a measurer measuring an output signal according to distance from the array of speakers, and intensity of the received acoustic signal versus measurement distance may be shown in a graph, thereby obtaining such an acoustic radiation pattern.

FIG. 1 shows an exemplary apparatus 100 to control an acoustic radiation pattern output through an array of speakers, that is, a speaker array.

The apparatus 100 includes a focusing filter 110, a controller 120, and a control pattern filter 130.

The focusing filter 110 processes an input signal to form an acoustic radiation pattern. The focusing filter 110 is generally used in a speaker array system processing an input signal to form a fixed acoustic radiation pattern. An acoustic radiation pattern formed by the focusing filter 110 may also be referred to as a reference pattern.

To form an intended acoustic radiation pattern (hereinafter, "intended pattern") using an array of speakers, a filter appropriate for the intended pattern is calculated and used. Since the filter is fixed by the intended pattern defined in advance, another filter is calculated to generate another acoustic radiation pattern. In a general environment, however, it is difficult to change a filter value of a speaker array system to transform an intended pattern (e.g., removal of an unnecessary pattern such as a sidelobe) according to change in a filter design method or environment.

The apparatus 100 performs an operation to transform an intended pattern without modifying the focusing filter 110. To this end, as one example, the apparatus 100 further includes the controller 120 and the control pattern filter 130.

A method of transforming an intended pattern without modifying the focusing filter 110 will be described with reference to FIGS. 2A and 2B.

Figure 2A:
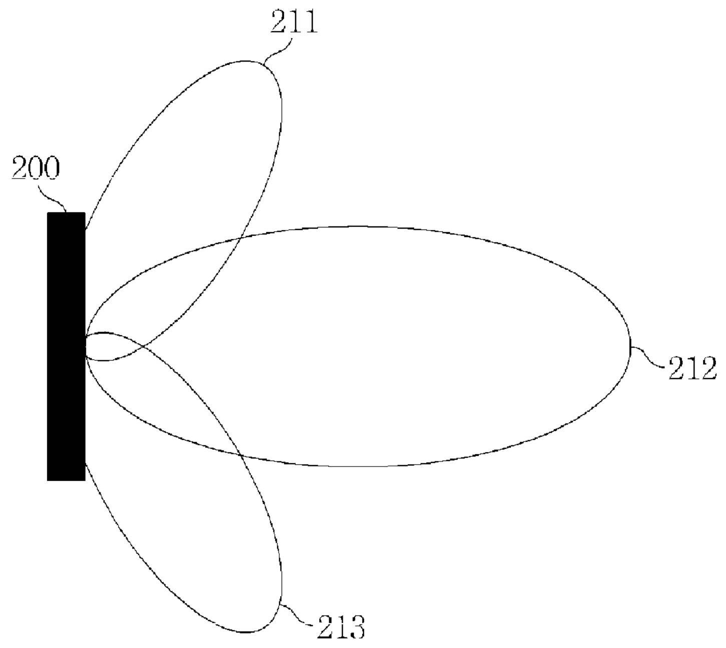
FIG. 2A is a diagram illustrating a reference pattern formed by a conventional focusing filter.
Figure 2B:
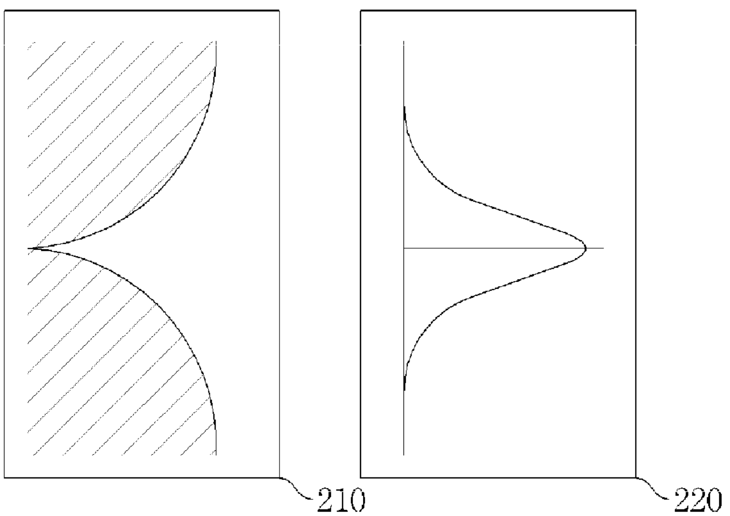
FIG. 2B is a diagram illustrating examples of a control pattern and a form factor to form an intended pattern according to an exemplary embodiment.

FIG. 2A illustrates an acoustic radiation pattern formed by a conventional focusing filter, and FIG. 2B illustrates examples of a control pattern and a form factor for forming an intended pattern according to an exemplary embodiment.

Referring to FIG. 2A, it is assumed that acoustic radiation patterns 211, 212 and 213 are formed by a speaker array device 200. A user may want to obtain the pattern 212 alone and remove the sidelobe patterns 211 and 213.

According to an exemplary embodiment, an input signal may be processed using a control pattern 210 and a form factor 220 shown in FIG. 2B, so as to remove the sidelobe patterns 211 and 213.

Here, control patterns denote some previously-defined acoustic radiation patterns radiated using an array of speakers. A filter value for forming a control pattern is applied to a plurality of array of speakers and thus may have a matrix form. In this case, the filter value for forming a control pattern may be called a control pattern matrix.

Meanwhile, a form factor denotes weight data about a control pattern. A form factor may be data indicating a weight for each control pattern used when two or more filter values are combined. A weight may be a constant, or a window-shaped value varying according to an acoustic signal of each channel output through an array of speakers as shown in a graph 220 of the form factor shown in FIG. 2B.

Referring back to FIG. 1, the control pattern filter 130 stores a plurality of filter values to form a plurality of corresponding control patterns set in advance from an input signal. The controller 120 calculates a compensation control pattern such that signals output through the array of speakers have an intended pattern, which is an intended acoustic radiation pattern, using a filter value of the focusing filter 110 and a filter value for the intended pattern. The controller 120 generates a control pattern selection signal to select at least one of control patterns stored in the focusing filter 110 in order to generate the compensation control pattern. Then, the control pattern filter 130 receives the control pattern selection signal, and processes the input signal using a filter value corresponding to the at least one control pattern selected according to the control pattern selection signal.

Examples of a control pattern will be described with reference to FIG. 3.

Figure 3:
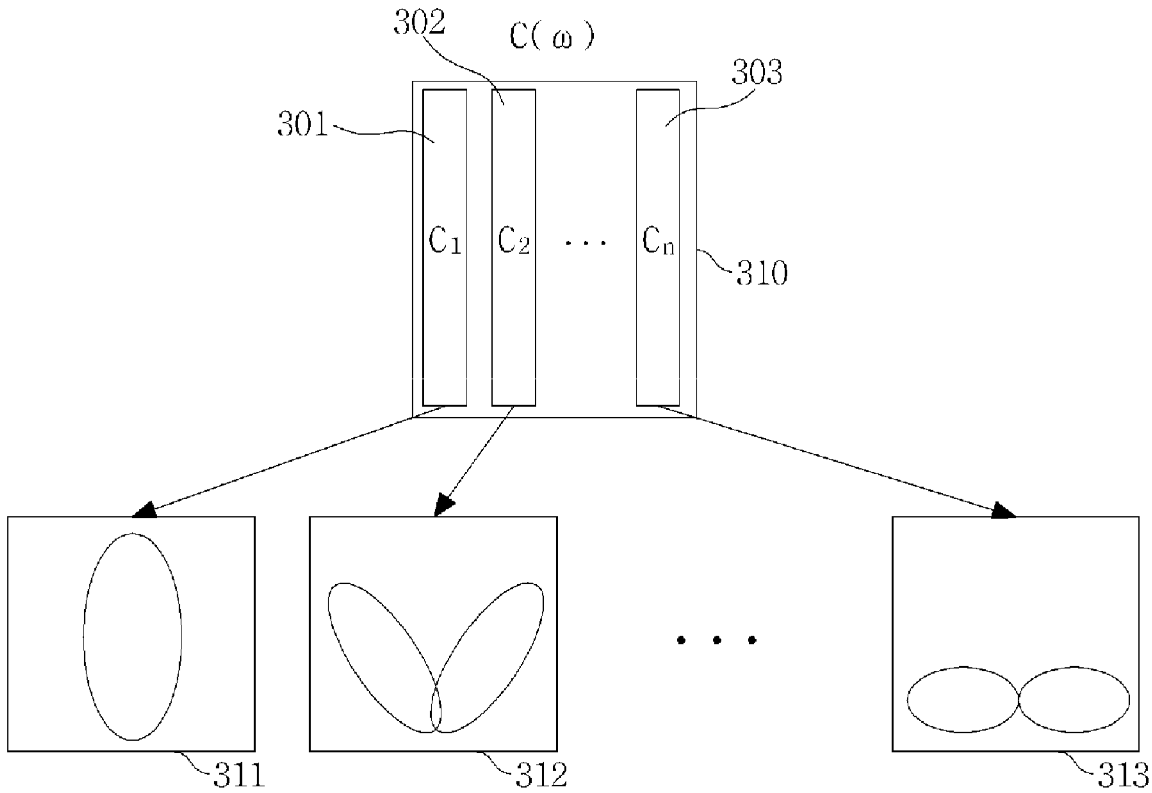
FIG. 3 is a diagram illustrating examples of a control pattern.

Referring to FIG. 3, in an exemplary control pattern filter 310, a plurality of control pattern matrices 301, 302 and 303 are defined. The control pattern matrices 301, 302 and 303 denote filter values corresponding to a plurality of control patterns 311, 312 and 313.

The control pattern matrices 301, 302 and 303 are of filter values for forming previously-defined patterns. The filter values corresponding to the patterns 311, 312 and 313 are calculated such that a beam pattern output from an array matches the previously-defined patterns 311, 312 and 313, and then the matrices 301, 302 and 303 are derived from the filter values.

For example, the control pattern matrix 302 may be generated by calculating a filter value corresponding to the control pattern 312 using a least square error (LSE) filter design method. Here, the filter value of the control pattern 312 is defined to be orthogonal to a filter value of a reference pattern formed by an initially-defined focusing filter such that an acoustic radiation pattern can be controlled without affecting the reference pattern. Also, when filter values of respective control patterns are defined to be orthogonal to each other, a new pattern may be generated by combining existing filter values of control patterns.

When an intended pattern is determined, an acoustic signal can be radiated in a defined pattern form using such a control pattern matrix.

For example, given that a filter vector indicating a filter value for a focusing filter is R and a filter vector of an intended pattern is C, a vector of a compensation control pattern is −R+C. In other words, when control patterns corresponding to −R and C are stored in the control pattern filter 130, the same effect as output of an input signal can be obtained using the vector (−R+C) of the compensation control pattern and finally the vector C of the intended pattern.

However, to form a pattern other than defined patterns, control patterns defined in advance is combined. Here, form factors are used to assign weights to pattern vectors and to combine them.

A form factor may be a constant, or a window-shaped weight varying according to channel. For example, when a pattern A and a pattern B are combined into a new pattern C, the pattern C, for example, (c1*A+c2*B), may be obtained by combining the pattern A with the pattern B using form factors c1 and c2.

For example, a compensation control pattern and a form factor may be calculated as described below.

Given that a signal obtained by processing an input signal x using a filter value $w_r$ of a focusing filter is v, a signal from a form factor $w_c$ and a control pattern C is c, and a signal obtained by adding the two signals v and c is u, v, c and u may be expressed as follows:

$$V=W_rX \quad \text{[Equation 1]}$$

$$c=Cw_cx \quad \text{[Equation 2]}$$

$$u=v-c=(w_r-Cw_c)x \quad \text{[Equation 3]}$$

Given that a transfer function between an output device and a response position is G, a response Y to the summed signal u is as follows:

$$Y=Gu=G(w_r-Cw_c)x \quad \text{[Equation 4]}$$

Here, regardless of the input signal x, a response pattern H according to frequency may be expressed as follows:

$$H=G(w_r-Cw_c) \quad \text{[Equation 5]}$$

Here, given that an intended response is D, an error between the target pattern D and the response pattern II is defined in Equation 6. Here, an optimum filter value is expressed in Equation 7 , and the optimum filter value based on the LSE filter design method is expressed in Equation 8.

$$E=|D-H|^2=|D-G(w_r-Cw_c)|^2 \quad \text{[Equation 6]}$$

$$w_a=(w_r-Cw_c) \quad \text{[Equation 7]}$$

$$w_a=(G^H G)^{-1}G^H D \quad \text{[Equation 8]}$$

By applying Equation 8 to Equation 7, a filter value for the control pattern C to form an intended pattern may be calculated. The optimum filter value $w_a$ is a filter value corresponding to the above-mentioned compensation control pattern.

Here, a form factor may be calculated using the LSE filter design method as expressed in Equation 9. Given that a difference between the filter value $w_r$ of a focusing filter and the optimum filter value $w_a$ is T, and an error between the form factor $w_c$ and the control pattern C is defined in Equation 10, an optimum form factor based on the LSE filter design method may be calculated as shown in Equation 11.

$$T = w_r - w_a \quad \text{[Equation 9]}$$

$$EE = |T - Cw_c|^2 \quad \text{[Equation 10]}$$

$$\begin{aligned} w_c &= (C^H C)^{-1} C^H T \\ &= (C^H C)^{-1} C^H (w_r - w_a) \end{aligned} \quad \text{[Equation 11]}$$

Meanwhile, a control pattern matrix may be expressed using output data of respective channels of an array of speakers. For example, given that a filter value, that is, a vector value, is defined as [1 1 1 1 1 1 1], a radiation pattern based on the filter value corresponds to a pattern radiated when all speakers in a seven-channel array output a signal at the same volume. In this way, simple forms of vectors such as [1 0 1 0 . . . ] and [1 −1 1 −1 . . . ] may be defined as pattern matrices, and pattern matrix values for the respective patterns are calculated and stored.

The apparatus 100 for controlling an acoustic radiation pattern may further include a user interface (not shown) which receives a user input signal for setting an intended pattern. An intended pattern may be input to the apparatus 100 to control an acoustic radiation pattern in various ways. For example, a user may select a plurality of control patterns, or may input a part and direction of an acoustic radiation pattern to be removed after the apparatus 100 shows the user the acoustic radiation pattern currently provided by the focusing filter. In this case, the controller 120 may select at least one of the control patterns based on the user input signal.

The controller 120 may generate a control pattern selection signal to select at least one of a control pattern to be added to a reference pattern formed by the focusing filter 130 and a control pattern to remove the whole or a part of the reference pattern. Then, the control pattern filter 130 may process an input signal using a control pattern selected according to the control pattern selection signal such that the intended pattern can be finally output.

Also, where an intended pattern may be not generated using the stored control patterns, the controller 120 may generate a control pattern selection signal to select at least two of the control patterns for at least one combination. Furthermore, the controller 120 may calculate form factors, which are weight data about the respective control patterns used for combining at least two filter values, to form the intended pattern. Then, the control pattern filter 130 may process the input signal using the control pattern selected according to the control pattern selection signal and the calculated form factors such that the intended pattern can be finally output.

As illustrated in FIG. 1, the controller 120 may include a control pattern setter 122 to set a control pattern, and a form factor calculator 124 to calculate a form factor. A signal generated by the control pattern setter 122 to select a control pattern and a form factor calculated by the form factor calculator 124 may be transferred to the control pattern filter 130.

Figure 4A:
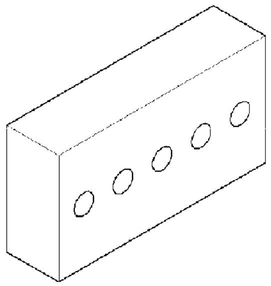
FIGS. 4A to 4C are diagrams illustrating exemplary structures for a speaker array device.
Figure 4B:
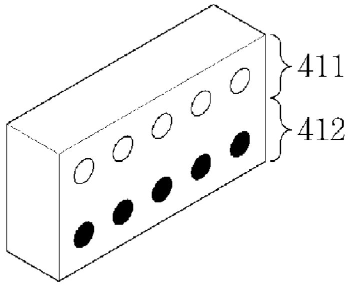
Figure 4C:
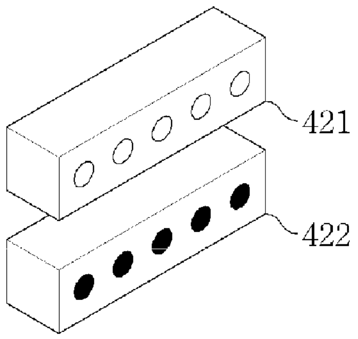

FIGS. 4A to 4C illustrate exemplary structures for a speaker array device.

FIG. 4A illustrates a structure of a speaker array device that performs acoustic focusing and controls an acoustic radiation pattern. The speaker array device of FIG. 4A may be used to modify a whole existing sound focusing pattern.

FIG. 4B illustrates a structure of a speaker array device of which a part is used to control an acoustic radiation pattern. The speaker array device of FIG. 4B is used when speakers in one array are grouped and the respective speaker groups separately control, control patterns. For example, an array group 411 may output a reference pattern processed by a focusing filter, and an array group 412 may output a compensation control pattern processed by the control pattern filter. Also, depending on the size of the array of speakers and the number of the speakers, a speaker array device may generate two patterns or a combination of at least two patterns.

FIG. 4C illustrates a case in which separate pattern control array devices are used to control an acoustic radiation pattern. FIG. 4C shows two completely separated acoustic systems 421 and 422. The one speaker array device 421 may form a fixed reference pattern, and the other speaker array device 422 may control the fixed reference pattern. For example, a speaker array system may be additionally installed in an apparatus such as a television (TV) speaker system and used to adjust an acoustic radiation pattern for a specific area in space.

Figure 5:
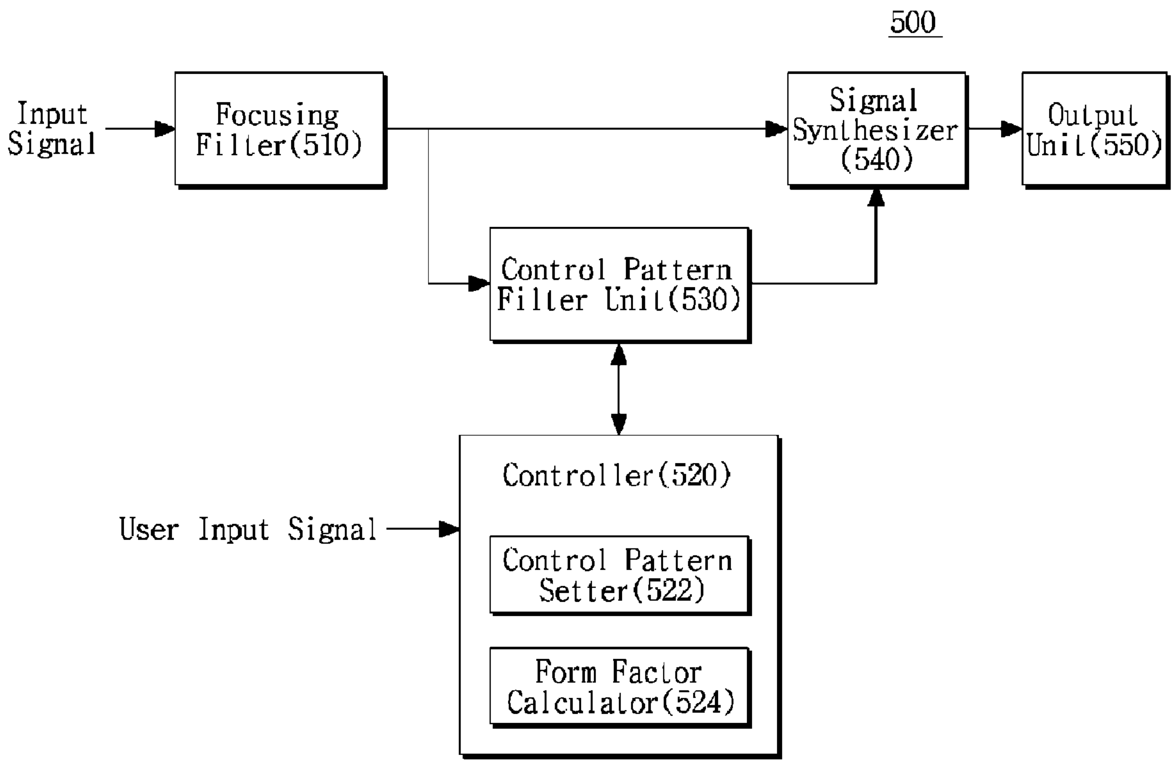
FIG. 5 is a block diagram illustrating an exemplary apparatus to control an acoustic radiation pattern whereby a signal processed by a focusing filter and a signal processed by a control pattern filter unit are synthesized and output.

FIG. 5 illustrates an exemplary apparatus 500 to control an acoustic radiation pattern, including the speaker array device shown in FIG. 4A.

The apparatus 500 includes a focusing filter 510, a controller 520, a control pattern filter unit 530, a signal synthesizer 540, and an output unit 550. The focusing filter 510, the controller 520 and the control pattern filter unit 530 correspond to the focusing filter 110, the controller 120 and the control pattern filter 130 shown in FIG. 1, perform similar functions, and thus further descriptions thereof will be omitted for conciseness.

The signal synthesizer 540 synthesizes a first output signal that is an input signal processed and output by the focusing filter 510 with a second output signal that is the input signal processed and output by the control pattern filter unit 530. The output unit 550 outputs the synthesized signal.

Figure 6A:
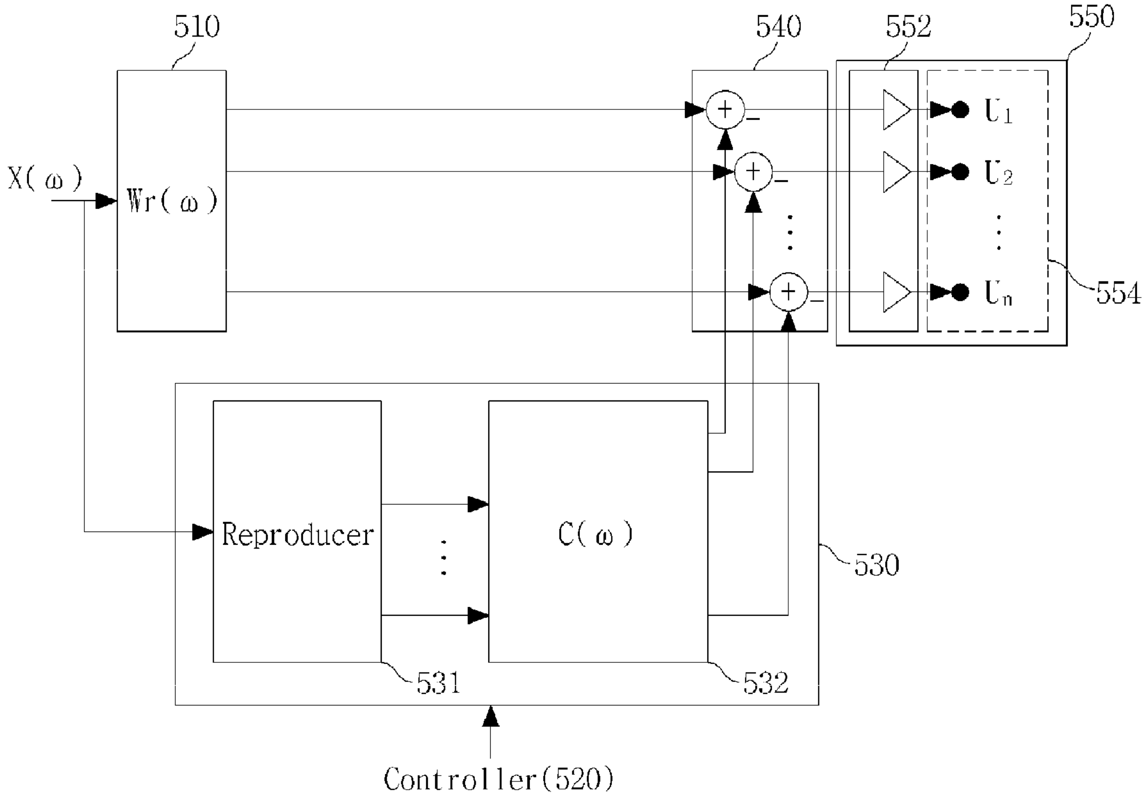
FIGS. 6A and 6B are diagrams further illustrating the details of the apparatus for controlling an acoustic radiation pattern shown in FIG. 5.
Figure 6B:
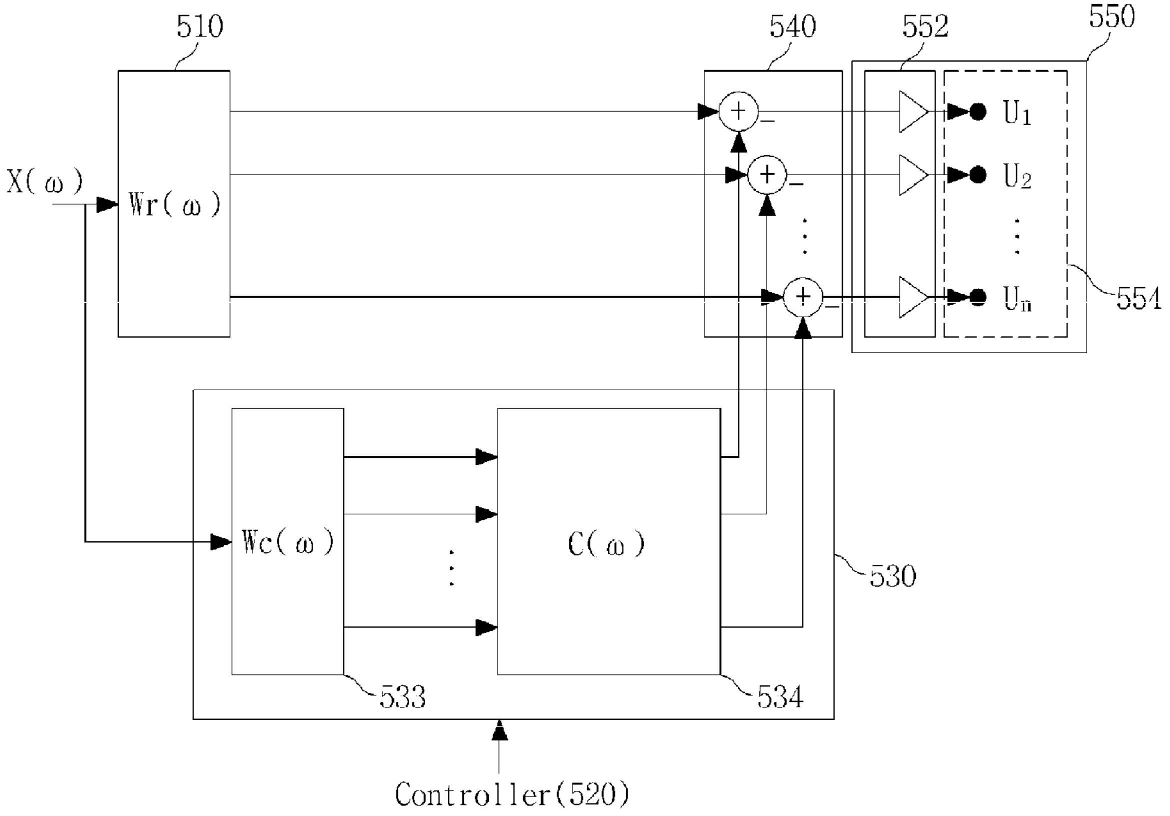

FIGS. 6A and 6B illustrate further details of the apparatus shown in FIG. 5.

The structure of FIG. 6A may be used when there are no control pattern combinations but when only control patterns defined in the control pattern filter unit 530 are used. An input signal x(ω) is separately processed by the focusing filter 510 and the control pattern filter unit 530. In the control pattern filter unit 530, the input signal x(ω) is reproduced as a multi-channel signal by a reproducer 531, processed by a control pattern filter 532 using a filter value corresponding to a control pattern set according to control of the controller 520, and transferred to the signal synthesizer 540.

The signal synthesizer 540 synthesizes the signals output from the focusing filter 510 and the control pattern filter 532 and outputs the synthesized signal to the output unit 550. An amplification unit 552 of the output unit 550 amplifies the input signal and outputs it to an array of speakers 554.

FIG. 6B illustrates further details the apparatus 500 for controlling an acoustic radiation pattern using a control pattern and a form factor.

An input signal x(ω) is separately processed by the focusing filter 510 and the control pattern filter unit 530. In the control pattern filter unit 530, the input signal x(ω) is reproduced as a multi-channel signal by a form factor filter 533 according to a form factor set by the controller 520, processed by a control pattern filter 534 using a filter value corresponding to a control pattern set according to control of the controller 520, and transferred to the signal synthesizer 540.

The signal synthesizer 540 synthesizes the signals output from the focusing filter 510 and the control pattern filter 534 and outputs the synthesized signal to the output unit 550. The amplification unit 552 of the output unit 550 amplifies the input signal and outputs it to the array speakers 554.

Figure 7:
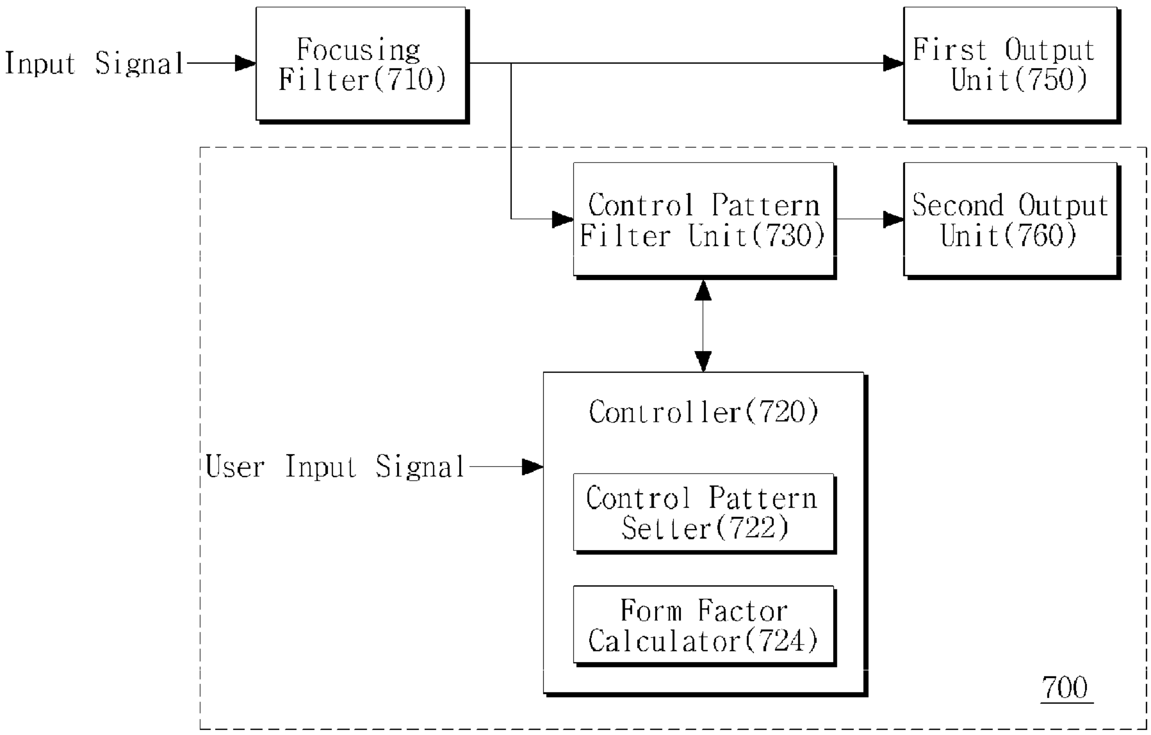
FIG. 7 is a block diagram illustrating an exemplary apparatus to control an acoustic radiation pattern whereby a signal processed by a focusing filter and a signal processed by a control pattern filter unit are separately output.

FIG. 7 illustrates an exemplary apparatus 700 to control an acoustic radiation pattern whereby a signal processed by a focusing filter and a signal processed by a control pattern filter unit are separately output.

The apparatus 700 may be additionally installed in a conventional speaker array device having a focusing filter 710 and a first output unit 750. The apparatus 700 includes a controller 720, a control pattern filter unit 730, and a second output unit 760.

The controller 720 receives a filter value of the focusing filter 710 processing an input signal to form one acoustic radiation pattern from another apparatus. The controller 720 calculates a compensation control pattern using the received filter value of the focusing filter 710 and a filter value for an intended pattern such that signals output through an array of speakers have the intended pattern. To form the compensation control pattern, a control pattern setter 722 generates a control pattern selection signal to select at least one of a plurality of control patterns set in advance in the control pattern filter unit 730.

The function and operation of the controller 720 and the control pattern filter unit 730 are similar to those of the above-described controller 120 and the control pattern filter 130, and thus will not be described again for conciseness.

The first output unit 750 outputs a first output signal that is an input signal processed and output by the focusing filter 710, and the second output unit 760 outputs a second output signal that is the input signal processed and output by the control pattern filter unit 730.

Figure 8:
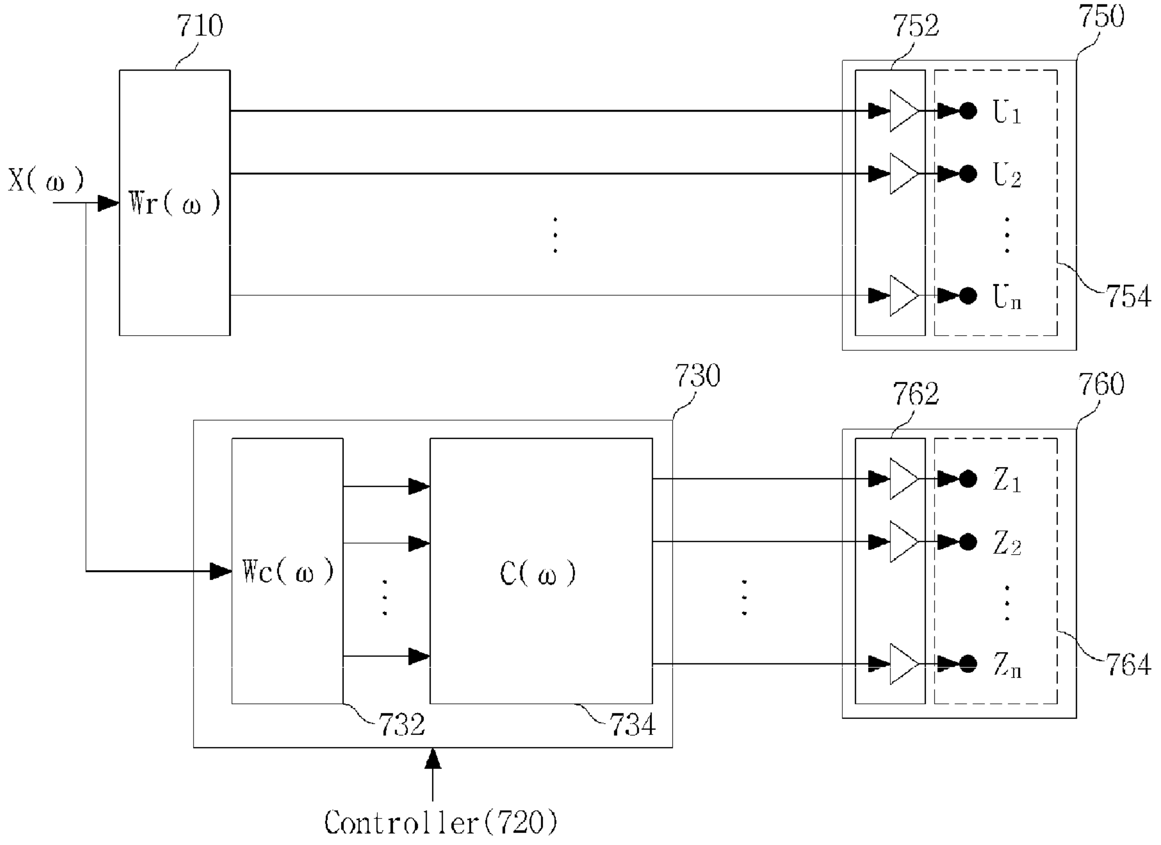
FIG. 8 is a diagram further illustrating the details of the apparatus for controlling an acoustic radiation pattern shown in FIG. 7.

FIG. 8 illustrates further details of the apparatus shown in FIG. 7.

When a focusing array device is not the same as the apparatus 700 for controlling an acoustic radiation pattern as illustrated in FIG. 7, a signal is separately processed and output though different devices as illustrated in FIG. 8.

An input signal x(ω) is separately processed by the focusing filter 710 and the control pattern filter unit 730. The signal processed by the focusing filter 710 is output to an array of speakers 754 via an amplifier unit 752 of the first output unit 750.

In the control pattern filter unit 730, the input signal x(ω) is reproduced as a multi-channel signal by a form factor filter 732 according to a form factor set by the controller 720, processed by a control pattern filter 734 using a filter value corresponding to a control pattern set according to control of the controller 720, and output to an array of speakers 764 via an amplifier unit 762 of the second output unit 760.

Figure 9:
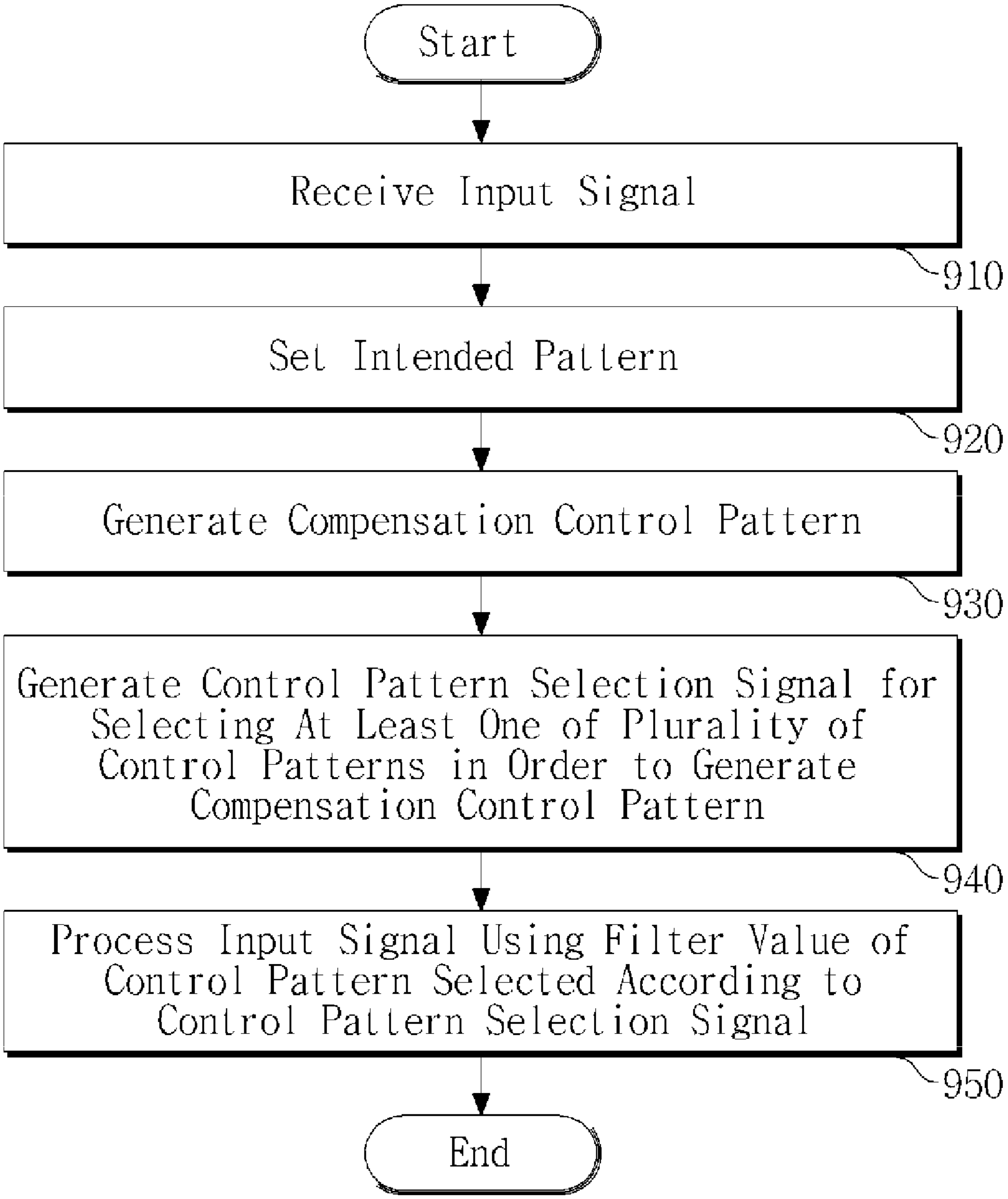
FIG. 9 is a flowchart showing an exemplary method of controlling an acoustic radiation pattern.

FIG. 9 is a flowchart showing an exemplary method of controlling an acoustic radiation pattern. The method may be performed by an apparatus described above to control an acoustic radiation pattern.

An input signal to be output through an array of speakers is received in operation 910. An intended pattern, which is an intended acoustic radiation pattern, is set in operation 920.

A compensation control pattern such that signals output through the array of speakers have the intended pattern is generated using a filter value of a focusing filter, which processes an input signal to form one acoustic radiation pattern, and a filter value for the intended pattern, in operation 930.

In operation 940, a control pattern selection signal for selecting at least one of a plurality of control patterns is generated in order to form the compensation control pattern. In operation 950, the input signal is processed using a filter value of the control pattern set depending on the control pattern selection signal.

Figure 10:
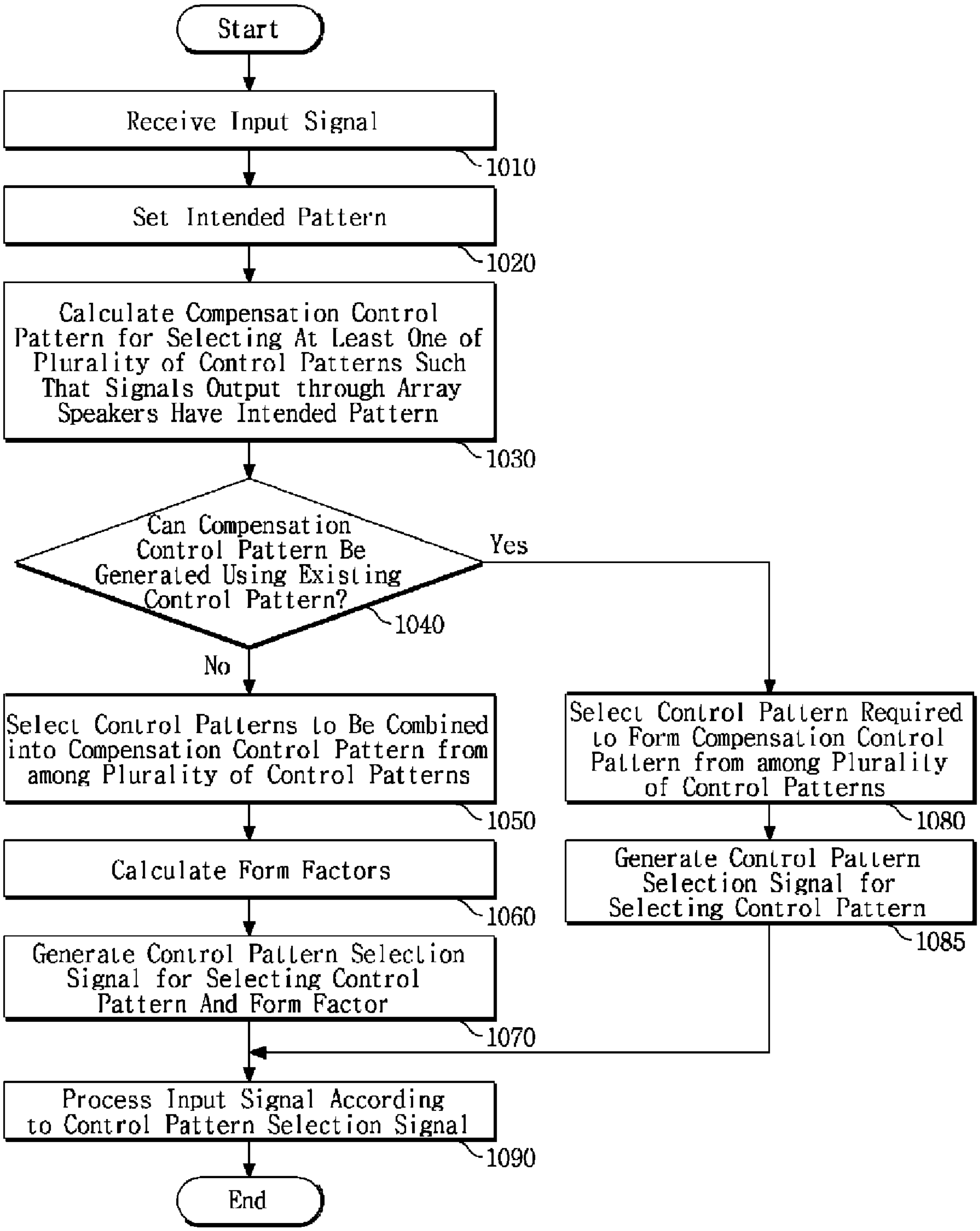
FIG. 10 is a flowchart showing another exemplary method of controlling an acoustic radiation pattern.

FIG. 10 is a flowchart showing another exemplary method of controlling an acoustic radiation pattern. The method may be performed by an apparatus described above to control an acoustic radiation pattern An input signal to be output through an array of speakers is received in operation 1010. An intended pattern, which is an intended acoustic radiation pattern, is set by a user input signal, in operation 1020.

In operation 1030, a compensation control pattern such that signals output through the array of speakers form the intended pattern is calculated using a filter value for a focusing filter to form a reference pattern and a filter value for the intended pattern.

In operation 1040, it is determined whether the compensation control pattern can be generated using a plurality of filter values corresponding to a plurality of control patterns defined in advance.

Where it is determined in operation 1040 that the compensation control pattern can be generated using a plurality of control patterns defined in advance, at least one of the control patterns is selected in operation 1080, and a control pattern selection signal is generated in operation 1085. For example, to form the intended pattern, the control pattern selection signal to select at least one of a control pattern to be added to the reference pattern formed by the focusing filter and a control pattern for removing the whole or a part of the reference pattern may be generated. The input signal is processed using a filter value of the control pattern selected according to the control pattern selection signal in operation 1090.

Where it is determined in operation 1040 that the compensation control pattern cannot be generated using a plurality of control patterns defined in advance, at least two of the control patterns are selected for at least one control pattern combination in operation 1050. Also, form factors, which are weight data about the respective control patterns, are calculated for the at least one control pattern combination in operation 1060. A control pattern selection signal to set the selected control patterns and the form factors is generated in operation 1070. The input signal is processed using the set control patterns and the calculated form factors in operation 1090.

According to example(s) described above, there is provided an apparatus and method for forming an intended beam pattern using a plurality of filter values for forming a plurality of corresponding control patterns set in advance from an input signal and form factors, whereby weights of the control patterns are adjusted.

The methods described above may be recorded, stored, or fixed in one or more computer-readable media that includes program instructions to be implemented by a computer to cause a processor to execute or perform the program instructions. The media may also include, alone or in combination with the program instructions, data files, data structures, and the like. Examples of computer-readable media include magnetic media, such as hard disks, floppy disks, and magnetic tape; optical media such as CD ROM disks and DVDs; magneto-optical media, such as optical disks; and hardware devices that are specially configured to store and perform program instructions, such as read-only memory (ROM), random access memory (RAM), flash memory, and the like. Examples of program instructions include machine code, such as produced by a compiler, and files containing higher level code that may be executed by the computer using an interpreter. The described hardware devices may be configured to act as one or more software modules in order to perform the operations and methods described above, or vice versa. In addition, a computer-readable recording medium may be distributed among computer systems connected through a network and computer-readable codes may be stored and executed in a decentralized manner.

A number of exemplary embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. An apparatus for controlling an acoustic radiation pattern output through an array of speakers, the apparatus comprising:

a focusing filter to process an input signal to form an acoustic radiation pattern;

a control pattern filter to store a plurality of filter values for forming a plurality of corresponding control patterns set in advance from the input signal, and process the input signal using a filter value corresponding to at least one control pattern selected according to a control pattern selection signal; and a controller to generate the control pattern selection signal for selecting the at least one of the control patterns in order to generate a compensation control pattern such that signals output through the array of speakers have an intended pattern, which is an intended acoustic radiation pattern, using a filter value of the focusing filter and a filter value for the intended pattern.

2. The apparatus of claim 1, further comprising a user interface to receive a user input signal for setting the intended pattern.

3. The apparatus of claim 2, wherein the user input signal for setting the intended pattern relates to at least one of a part and a direction of the input signal which a user intends for the controller to remove such that the output of the array of speakers corresponds to the intended pattern.

4. The apparatus of claim 3, wherein the user interface is configured to allow a user to input the user input signal for setting the intended pattern based at least partially on a current output of the array of speakers.

5. The apparatus of claim 1, wherein to generate the compensation control pattern, the controller generates the control pattern selection signal to select at least one of a control pattern to be added to a reference pattern formed by the focusing filter and a control pattern for removing the whole or a part of the reference pattern.

6. The apparatus of claim 1, wherein in response to the compensation control pattern not being included in the plurality of control patterns, the controller generates the control pattern selection signal to select at least two of the control patterns to be combined into the compensation control pattern.

7. The apparatus of claim 6, wherein in response to the controller combining the at least two control patterns into the compensation control pattern, the controller calculates form factors that are weight data about the respective control patterns used to combine the at least two control patterns.

8. The apparatus of claim 1, wherein the filter value of a reference pattern formed by the focusing filter is orthogonal to a plurality of filter values corresponding to the plurality of control patterns, and the filter values corresponding to the control patterns are orthogonal to each other.

9. The apparatus of claim 1, further comprising:

a signal synthesizer to synthesize a first output signal that is the input signal processed and output by the focusing filter with a second output signal that is the input signal processed and output by the control pattern filter; and an output unit to output the synthesized signal.

10. The apparatus of claim 1, further comprising:

a first output unit to output a first output signal that is the input signal processed and output by the focusing filter; and a second output unit to output a second output signal that is the input signal processed and output by the control pattern filter.

11. An apparatus for controlling an acoustic radiation pattern output through an array of speakers, the apparatus comprising:

a control pattern filter to store a plurality of filter values for forming a plurality of corresponding control patterns set in advance from an input signal, and process the input signal using a filter value corresponding to at least one control pattern selected according to a control pattern selection signal; and a controller to receive a filter value of a focusing filter processing the input signal to form an acoustic radiation pattern from another apparatus, and generate the control pattern selection signal to select the at least one of the control patterns in order to generate a compensation control pattern such that signals output through the array of speakers have an intended pattern using the filter value of the focusing filter and a filter value for the intended pattern.

12. The apparatus of claim 11, further comprising a user interface to receive a user input signal for setting the intended pattern.

13. The apparatus of claim 12, wherein the user input signal for setting the intended pattern relates to at least one of a part and a direction of the input signal which a user intends for the controller to remove such that the output of the array of speakers corresponds to the intended pattern.

14. The apparatus of claim 13, wherein the user interface is configured to allow a user to input the user input signal for setting the intended pattern based at least partially on a current output of the array of speakers.

15. The apparatus of claim 11, wherein to generate the compensation control pattern, the controller generates the control pattern selection signal to select at least one of a control pattern to be added to a reference pattern formed by the focusing filter and a control pattern for removing the whole or a part of the reference pattern.

16. The apparatus of claim 11, wherein in response to the compensation control pattern not being included in the plurality of control patterns, the controller generates the control pattern selection signal to select at least two of the control patterns to be combined into the compensation control pattern.

17. The apparatus of claim 16, wherein in response to the controller combining the at least two control patterns into the compensation control pattern, the controller calculates form factors that are weight data about the respective control patterns used to combine the at least two control patterns.

18. A method of controlling an acoustic radiation pattern output through an array of speakers, the method comprising:

setting an intended pattern that is an intended acoustic radiation pattern;

generating a compensation control pattern such that signals output through the array of speakers have the intended pattern using a filter value of a focusing filter processing an input signal received in advance to form an acoustic radiation pattern and a filter value for the intended pattern;

generating a control pattern selection signal to select at least one of a plurality of control patterns in order to generate the compensation control pattern; and processing the input signal using a filter value corresponding to the control pattern selected according to the control pattern selection signal.

19. The method of claim 18, further comprising receiving a user input signal to set the intended pattern.

20. The method of claim 19, wherein the user input signal for setting the intended pattern relates to at least one of a part and a direction of the input signal which a user intends for the controller to remove such that the output of the array of speakers corresponds to the intended pattern.

21. The method of claim 20, wherein the user input signal for setting the intended pattern is based at least partially on a current output of the array of speakers.

22. The method of claim 18, wherein the processing of the input signal comprises generating the control pattern selection signal to select at least one of a control pattern to be added to a reference pattern formed by the focusing filter and a control pattern for removing the whole or a part of the reference pattern in order to generate the compensation control pattern.

23. The method of claim 18, wherein the processing of the input signal comprises, in response to the compensation control pattern not being included in the plurality of control patterns, generating the control pattern selection signal to select at least two of the control patterns to be combined into the compensation control pattern.

24. The method of claim 23, wherein the processing of the input signal comprises calculating form factors that are weight data about the at least two control patterns to combine the control patterns, and processing the input signal using filter values corresponding to the selected control patterns and the calculated form factors.

25. The method of claim 18, further comprising receiving the filter value of the focusing filter processing the input signal to form an acoustic radiation pattern from another apparatus.

* * * * *